US008604436B1

(12) United States Patent
Patel et al.

(10) Patent No.: US 8,604,436 B1
(45) Date of Patent: Dec. 10, 2013

(54) PROXIMITY SENSOR DEVICE

(75) Inventors: Pradip Dhirajlal Patel, Redwood City, CA (US); Ajay Kumar Ghai, San Jose, CA (US); Steve Detlev Cate, Los Altos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 167 days.

(21) Appl. No.: 13/071,168

(22) Filed: Mar. 24, 2011

(51) Int. Cl.
*G01J 5/00* (2006.01)

(52) U.S. Cl.
USPC .................................................. 250/338.1

(58) Field of Classification Search
USPC ..................................................... 250/338.1
See application file for complete search history.

(56) References Cited

U.S. PATENT DOCUMENTS

| | | | | |
|---|---|---|---|---|
| 5,831,268 | A * | 11/1998 | Morita et al. | 250/341.8 |
| 7,321,120 | B1 * | 1/2008 | Gorman et al. | 250/338.1 |
| 8,143,608 | B2 * | 3/2012 | Yao et al. | 250/551 |
| 8,217,482 | B2 * | 7/2012 | Basoor et al. | 257/436 |
| 2009/0159900 | A1 * | 6/2009 | Basoor et al. | 257/82 |
| 2010/0258710 | A1 * | 10/2010 | Wiese et al. | 250/214.1 |
| 2010/0327164 | A1 * | 12/2010 | Costello et al. | 250/338.1 |
| 2011/0057104 | A1 * | 3/2011 | Yao et al. | 250/338.1 |
| 2011/0121181 | A1 * | 5/2011 | Costello et al. | 250/338.1 |
| 2011/0133941 | A1 * | 6/2011 | Yao et al. | 340/600 |
| 2011/0186736 | A1 * | 8/2011 | Yao et al. | 250/338.4 |
| 2011/0204233 | A1 * | 8/2011 | Costello et al. | 250/338.4 |
| 2011/0226952 | A1 * | 9/2011 | Shih et al. | 250/338.1 |
| 2012/0217397 | A1 * | 8/2012 | Noone et al. | 250/338.1 |
| 2012/0223231 | A1 * | 9/2012 | Nijaguna | 250/338.1 |

* cited by examiner

*Primary Examiner* — David Porta
*Assistant Examiner* — Taeho Jo
(74) *Attorney, Agent, or Firm* — Advent, LLP

(57) ABSTRACT

Proximity sensor devices are described that integrate a light emitting diode with a light sensor assembly in a single, compact package. The proximity sensor devices comprise a lead frame having a surface. The light emitting diode and light sensor assembly are mounted to the lead frame proximate to the surface. The light emitting diode is configured to emit electromagnetic radiation in a limited spectrum of wavelengths, while the light sensor assembly is configured to detect electromagnetic radiation in the limited spectrum of wavelengths emitted by the light emitting diode. An encapsulation layer is formed on the surface over the light emitting diode and light sensor assembly. A trench is formed in the encapsulation layer to receive electromagnetic radiation blocking material configured to block electromagnetic radiation in the limited spectrum of wavelengths to at least partially mitigate crosstalk between the light emitting diode and the light sensor assembly.

22 Claims, 10 Drawing Sheets

PROXIMITY SENSOR DEVICE

BACKGROUND

Electronic devices, such as smart phones, tablet computers, digital media players, and so forth, increasingly employ optical proximity sensors to detect nearby objects without any physical contact between the object and the device. In this manner, proximity sensors may be used to control the manipulation of a variety of functions provided by such devices. For example, an electronic device such as a smart phone may use a proximity sensor to detect when the device is held near the face and ear of its user to deactivate the display and touchscreen of the device. This allows the device to conserve battery power and prevent inadvertent inputs from the user's face and ear. Optical proximity sensors typically include a light emitting diode (LED) that emits electromagnetic radiation in a limited spectrum of wavelengths (e.g., infrared (IR)) that are reflected by objects near the proximity sensor. A light sensor receives the reflected electromagnetic radiation which is converted to an electrical signal (e.g., a current or voltage) indicative of the presence of an object. In some instances, the light sensor may also function as an ambient light sensor to control the brightness of the device's display based upon the surrounding ambient light environment.

SUMMARY

Proximity sensor devices are described that integrate a light emitting diode and a light sensor assembly in a single, compact package. In one or more implementations, the proximity sensor devices may comprise a lead frame having a surface. The light emitting diode and light sensor assembly are mounted to the lead frame proximate to the surface. The light emitting diode is configured to emit electromagnetic radiation in a limited spectrum of wavelengths (e.g., infrared (IR)), while the light sensor assembly is configured to detect electromagnetic radiation in a broad spectrum of wavelengths, including the limited spectrum of wavelengths emitted by the light emitting diode (e.g., infrared (IR)), visible light, and so on. An encapsulation layer is provided on the surface over the light emitting diode and light sensor assembly. The encapsulation layer includes a trench formed therein to receive electromagnetic radiation blocking material configured to block electromagnetic radiation in the limited spectrum of wavelengths to at least partially mitigate crosstalk between the light emitting diode and the light sensor assembly.

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

Figure 1:
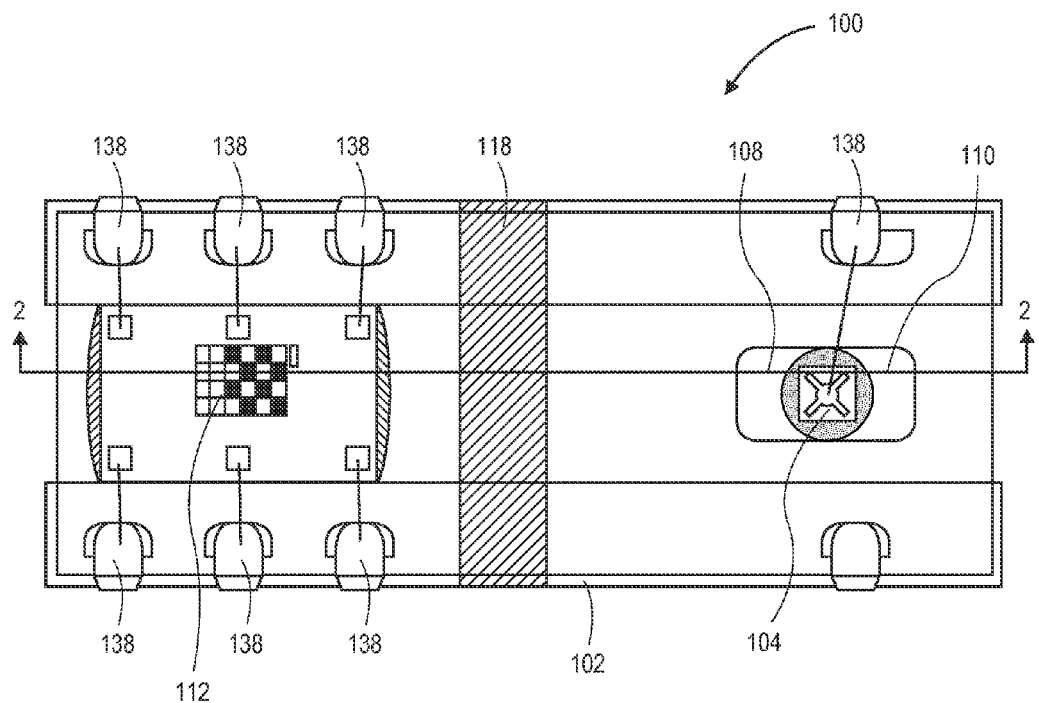
FIG. 1 is a diagrammatic top surface plan view illustrating a proximity sensor device in accordance with an example implementation of the present disclosure.
Figure 2:
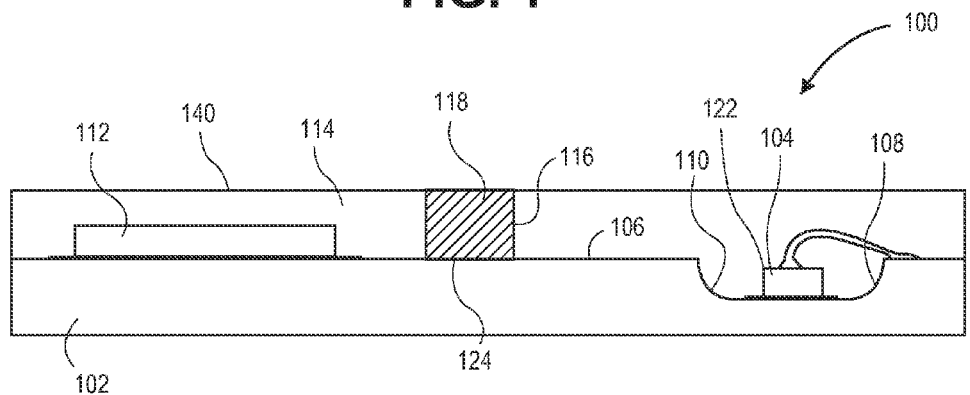
FIG. 2 is a diagrammatic cross-sectional side elevation view illustrating the proximity sensor device of FIG. 1 taken along plane 2-2.

Proximity sensors used in electronic devices may employ discrete light emitting diodes (e.g., an infrared light emitting diode (IR-LED)) and light sensor assemblies (e.g., an IR light sensor, an integrated IR/ambient light sensor, etc.) that are separately packaged and mounted to a printed circuit board (PCB) of the device. This arrangement requires a relatively large amount of space on the printed circuit board. Moreover, to mitigate cross-talk between the light emitting diode and the light sensor assembly, a physical barrier may be formed in the glass cover over the proximity sensor between the component packages. This physical barrier increases the amount of printed circuit board space used by the proximity sensor.

Consequently, proximity sensors were developed that integrate the light emitting diode and the light sensor assembly into single integrated packages that are mounted to the printed circuit board. In one example, the integrated packages utilize a conventional lead frame that includes dual pre-molded cavities for the light emitting diode and light sensor assembly. In other examples, the integrated packages are fabricated using organic laminated substrates or a printed circuit board with a metal cap. However, these integrated packages have large form factors due to constraints imposed by conventional packaging technologies. For example, the pre-molding process used with conventional lead frames requires relatively tall and wide cavity walls for mechanical strength and robustness. Similarly, integrated packages fabricated from organic laminated substrates or using a printed circuit board and metal cap tend to have an undesirably high profile or thickness. None of the integrated packages facilitate mounting of a physical barrier to mitigate cross-talk between the light emitting diode and light sensor assembly.

Accordingly, techniques are described for fabricating proximity sensor devices that integrate a light emitting diode (e.g., an infrared light emitting diode (IR-LED)) and a light sensor assembly (e.g., an IR light sensor, an integrated IR/ambient light sensor, etc.) in a single, compact package. The proximity sensor devices may comprise a package that employs an encapsulated lead frame. A light emitting diode configured to emit electromagnetic radiation in a limited spectrum of wavelengths (e.g., infrared (IR)) is mounted to the lead frame proximate to the surface of the lead frame. For example, the light emitting diode may be mounted within a reflector formed in the surface of the lead frame to collimate the electromagnetic radiation emitted by the light emitting diode. A light sensor assembly is mounted to the lead frame on the surface. The light sensor assembly is configured to detect electromagnetic radiation in a broad spectrum of wavelengths. An encapsulation layer is formed on the surface over the light emitting diode and light sensor assembly. The encapsulation layer includes a trench formed therein to receive electromagnetic radiation blocking material configured to block electromagnetic radiation in the limited spectrum of wavelengths emitted by the light emitting diode to at least partially mitigate crosstalk between the light emitting diode and the light sensor assembly. In one or more implementations, the encapsulation layer further includes a second trench formed therein between the first trench and the light sensor assembly. The second trench is configured to receive an electromagnetic radiation barrier operable to block electromagnetic radiation in a limited spectrum of wavelengths to further mitigate crosstalk between the light emitting diode and the light sensor assembly. In a possible embodiment, two trenches can be combined to have one large trench filled with radiation blocking material and a central cut to serve dual function.

Example Implementations

FIGS. 1 through 14 illustrate proximity sensor devices 100 in accordance with example implementations of the present disclosure. As shown, the proximity sensor devices 100 comprise integrated packages that include a lead frame 102. The lead frame 102 functions to furnish mechanical support to the components of proximity sensor device 100 and provide electronic interconnectivity to the proximity sensor device 100 (e.g., provide interconnectivity between other electronic components and the proximity sensor device 100, and so forth). In one or more implementations, the integrated package may comprise a flat no leads package such as a QFN (Quad Flat No leads) package, a DFN (Dual Flat No leads) package, or the like. The lead frame 102 may be comprised of a copper lead frame, or the like. However, other lead frame structures are possible.

One or more light emitting diodes (a single light emitting diode 104 is illustrated) are mounted near a surface 106 of the lead frame 102. The light emitting diode 104 is configured to emit electromagnetic radiation in a limited spectrum of wavelengths. For example, the light emitting diode 104 may be an infrared light emitting diode (IR-LED) configured to emit electromagnetic radiation in the infrared light spectrum. The infrared light spectrum (infrared light) includes electromagnetic radiation that ranges in wavelength from approximately seven hundred (700) nanometers to approximately three hundred thousand (300,000) nanometers. The light emitting diode 104 may also be configured to emit electromagnetic radiation in a known, predetermined pattern (e.g., emits a square wave of known width and frequency for a predetermined time).

The light emitting diode 104 may be positioned in a reflector 108 to collimate the electromagnetic radiation emitted from the light emitting diode 104, which increases the peak power of the emitted electromagnetic radiation. As illustrated, the reflector 108 may be formed as a dish 110 recessed in the surface 106 of the lead frame 102 so that the light emitting diode 104 is positioned at least partially below the surface 106, reducing the height of the package. In one or more implementations, the reflector 108 may be etched into the surface 106 of the lead frame 102 via suitable etching techniques. However, it is contemplated that other fabrication techniques may be used. The reflector 108 may further be coated with a material or materials that reflect, or at least partially reflect, electromagnetic radiation within the spectrum emitted by the light emitting diode 104. For instance, where the light emitting diode 104 comprises an IR-LED, the reflector 108 may be coated with materials that reflect electromagnetic radiation occurring in the infrared light spectrum. Example materials include, but are not limited to: nickel, silver, aluminum plating, or the like.

In one or more implementations, the reflector 108 may comprise a parabolic reflector. Thus, the recessed dish 110 may be formed to have an at least substantially parabolic cross-section. However, it is contemplated that the reflector 108 may have a variety of shapes (e.g. spherical, elliptical, faceted, etc.) depending on design requirements. Further, it is contemplated that the light emitting diode 104 may be mounted to the surface 106 of the lead frame 102 without a reflector 108.

A light sensor assembly 112 is mounted proximate to the surface 106 of the lead frame 102 opposite the light emitting diode 104. The light sensor assembly 112 is configured to detect electromagnetic radiation in the spectrum of wavelengths emitted by the light emitting diode 104 that is reflected off an object in close proximity to the proximity sensor device 100. For instance, where the light emitting diode 104 comprises an IR-LED, the light sensor assembly 112 may be configured to detect electromagnetic radiation within the infrared light spectrum. In implementations, the light sensor assembly may employ photodetectors such as photodiodes, phototransistors, or the like, that convert received electromagnetic radiation in the limited spectrum of wavelengths emitted by the light emitting diode 104 (e.g., infrared) into an electrical signal (e.g., a current or voltage).

The light sensor assembly 112 may further be configured to detect the ambient light environment surrounding the proximity sensor device 100. For example, the light sensor assembly 112 may detect electromagnetic radiation occurring in the visible light spectrum (e.g., electromagnetic radiation having a wavelength ranging from approximately three hundred and ninety (390) nanometers to approximately seven hundred and fifty (750) nanometers) incident on the light sensor assembly 112. Thus, the light sensor assembly 112 may be configured to detect electromagnetic radiation occurring in both the infrared light spectrum and the visible light spectrum that is incident on the light sensor assembly 112. It is contemplated that the light sensor assembly 112 may also detect electromagnetic radiation emitted from a nearby object (e.g., another electronic device with an IR transmitter).

An encapsulation layer 114 is provided on the surface 106 of the lead frame 102 over the light emitting diode 104 and the light sensor assembly 112. The encapsulation layer 114 is formed of a material that is at least substantially transparent to electromagnetic radiation within the limited spectrum of wavelengths emitted by the light emitting diode 104 and/or received by the light sensor assembly 112 (e.g., infrared). In this manner, electromagnetic radiation emitted by the light emitting diode 104 and/or reflected from an object in proximity to the proximity sensor device 100 may pass through the encapsulation layer 114. In one or more implementations, the encapsulation layer 114 is fabricated of a transparent epoxy material that allows at least approximately ninety (90) percent of the electromagnetic radiation incident on the encapsulation layer 114 to pass through the layer 114. However, other transparent materials (e.g., glass) may be used. Moreover, it is contemplated that the encapsulation layer 114 could be fabricated of materials that are translucent or opaque and provided with transparent windows for the light emitting diode 104 and light sensor assembly 112.

A trench 116 is provided in the encapsulation layer 114 between the light emitting diode 104 and the light sensor assembly 112. The trench 116 is at least partially filled with electromagnetic radiation blocking material 118 configured to block (e.g., to reflect and/or absorb) electromagnetic radiation at least within the limited spectrum of wavelengths emitted by the light emitting diode 104. As shown, the trench 116 may be formed so that it extends completely through the encapsulation layer 114 (e.g., the depth of the trench 116 is at least equal to the thickness of the encapsulation layer 114). In this manner, the electromagnetic radiation blocking material 118 may extend from at least the surface 106 of the lead frame 102 to an outer surface 140 of the encapsulation layer 114. However, it is contemplated that the trench 116 may extend past the surface 106 of the lead frame 102 and into the lead frame 102, so that the electromagnetic radiation blocking material 118 extends below the surface 106 of the lead frame 102. It is also contemplated that, in one or more implementations, the trench 116 may extend only partially through the encapsulation layer 114 (e.g., does not extend to the surface 106 of the lead frame 102). In such implementations, the electromagnetic radiation blocking material 118 would also not extend to the surface 106 of the lead frame 102.

The trench 116 may have adequate width to hold an amount (e.g., thickness) of electromagnetic radiation blocking material 118 that is sufficient to effectively block electromagnetic radiation from the light emitting diode 104 within the encapsulation layer 114 within the size constraints of the lead frame 102. Thus, it will be appreciated that the depth and the width of trench 116 will depend on the particular design/performance requirements of the proximity sensor device 100 (e.g., the characteristics (size, power, sensitivity, etc.) of the light emitting diode 104 and light sensor assembly 112, the size of the lead frame 102, the thickness of the encapsulation layer 114, the encapsulation layer 114 material, the electromagnetic radiation blocking material 118 selected, and so forth).

In implementations, as illustrated in FIGS. 2, 3, 5, and 6, the light emitting diode 104 is positioned in the reflector 108, which allows the topmost surface point 122 of the light emitting diode 104 to be below the bottommost point 124 of the trench 116. The position of the trench 116 (and electromagnetic radiation blocking material 118) along the surface 106 of the lead frame 102 (e.g., between the light emitting diode 104 and the light sensor assembly 112) may be selected based on the particular design/performance requirements of the proximity sensor device 100 and/or the fabrication techniques employed. In the implementations shown in FIGS. 1 through 6, the trench 116 is illustrated as being positioned approximately in the middle of the lead frame 102 between the light emitting diode 104 and the light sensor assembly 112. However, it is contemplated that the position of trench 116 may vary. For example, in one or more implementations, the trench 116 may be formed closer to light emitting diode 104 and farther from light sensor assembly 112. In other implementations, the trench 116 may be formed closer to light sensor assembly 112 and farther from light emitting diode 104.

The electromagnetic radiation blocking material 118 may be configured in a variety of ways. For example, in the implementation shown in FIGS. 1 through 3, the electromagnetic radiation blocking material 118 may fill the trench 116 so that the top surface 120 of the material 118 is at least approximately flush (level) with the outer surface 140 of the encapsulation layer. In another implementation, shown in FIGS. 4 through 6, the electromagnetic radiation blocking material 118 may extend beyond the outer surface 140 of the encapsulation layer 114 so that the top surface 120 of the electromagnetic radiation blocking material 118 is above the surface 140. However, it is also contemplated that in some implementations, it may be unnecessary for the electromagnetic blocking material 118 to completely fill the trench 116. Thus, the top surface 120 of the electromagnetic radiation blocking material 118 may be below the outer surface 140 of the encapsulation layer 114.

As noted, the electromagnetic radiation blocking material 118 may comprise a material that blocks (e.g., reflects and/or absorbs) electromagnetic radiation at least within the limited spectrum of wavelengths emitted by the light emitting diode 104. For example, in implementations where the light emitting diode 104 comprises a IR-LED, the electromagnetic radiation blocking material 118 may comprise a material that is capable of at least substantially blocking (e.g., reflecting and/or absorbing) electromagnetic radiation within the infrared spectrum. However, it is contemplated that both electromagnetic radiation in the visible light spectrum and the infrared light spectrum may be blocked by the electromagnetic radiation blocking material 118. In one example, the electromagnetic radiation blocking material 118 may be comprised of an electromagnetic radiation blocking epoxy material, such as an infrared light blocking epoxy material. In another example, the electromagnetic radiation blocking material 118 may comprise a resilient material such as silicone. Other examples are possible.

Figure 7:
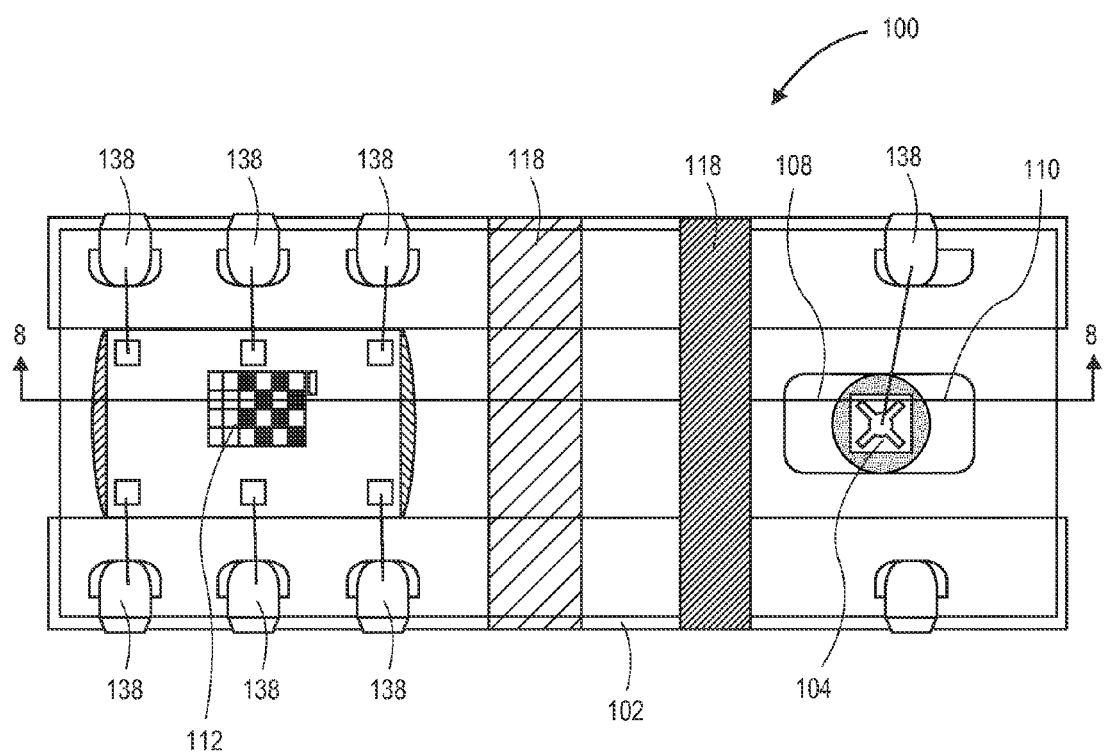
FIG. 7 is a diagrammatic top surface plan view illustrating a proximity sensor device in accordance with an example implementation of the present disclosure.
Figure 8:
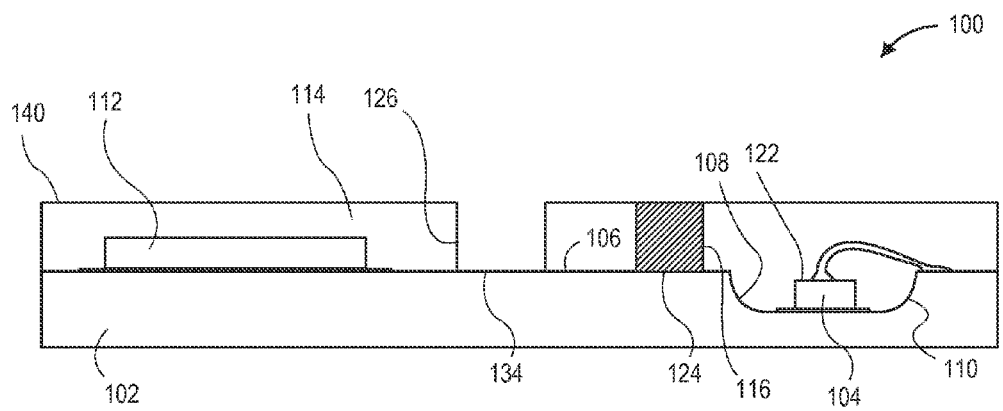
FIG. 8 is a diagrammatic cross-sectional side elevation view illustrating the proximity sensor device of FIG. 7 taken along plane 8-8.
Figure 9:
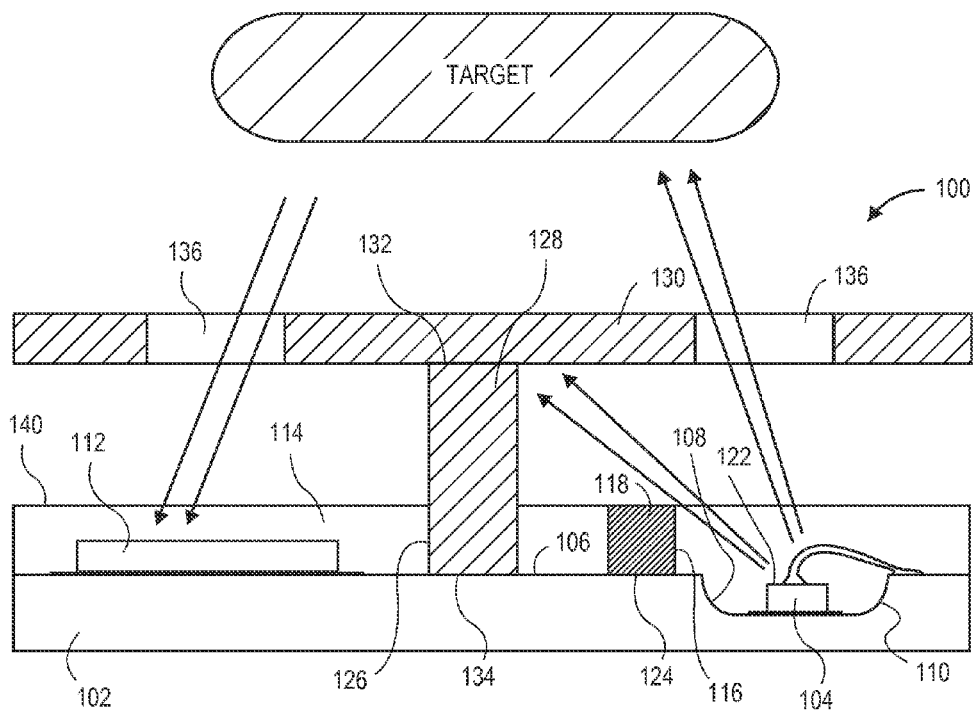
FIG. 9 is a diagrammatic partial cross-sectional elevation view illustrating the electronic device of FIG. 8 in an example environment, wherein the proximity sensor device is shown mounted within an electronic device beneath a cover.

As illustrated in FIGS. 7 through 9, the proximity sensor device 100 may further include a second trench 126 provided in the encapsulation layer 114 between the first trench (trench 116) and the light sensor assembly 112. Thus, as shown, the first trench 116 is positioned proximate to the light emitting diode 104, and the second trench 126 is positioned proximate to the light sensor assembly 112. The second trench 126 is configured to receive an electromagnetic radiation barrier 128 operable to block electromagnetic radiation in the spectrum of wavelengths emitted by the light emitting diode 104 to further mitigate crosstalk between the light emitting diode 104 and the light sensor assembly 112.

The second trench 126 may be formed so that it extends completely through the encapsulation layer 114 (e.g., the depth of the second trench 126 is at least equal to the thickness of the encapsulation layer 114). However, like the first trench 116, it is contemplated that the second trench 126 may extend past the surface 106 of the lead frame 102 and into the lead frame 102, so that the electromagnetic radiation barrier 128 may extend below the surface 106 of the lead frame 102. It is also contemplated that, in one or more implementations, the second trench 126 may extend only partially through the encapsulation layer 114 (e.g., does not extend to the surface 106 of the lead frame 102). In such implementations, the electromagnetic radiation barrier 128 would also not extend to the surface 106 of the lead frame 102. Moreover, the second trench 126 may have a width that is adequate to receive the electromagnetic radiation barrier 128 within the size constraints of the lead frame 102.

The electromagnetic radiation barrier 128 may comprise a material that blocks (e.g., reflects and/or absorbs) electromagnetic radiation at least within the limited spectrum of wavelengths emitted by the light emitting diode 104. For example, in implementations where the light emitting diode 104 comprises an IR-LED, the electromagnetic radiation barrier 118 may comprise a material that is capable of at least substantially blocking (e.g., reflecting and/or absorbing) electromagnetic radiation within the infrared spectrum. However, it is contemplated that both electromagnetic radiation in the visible light spectrum and the infrared light spectrum may be blocked by the electromagnetic radiation barrier 128. In one example, the electromagnetic radiation barrier 128 may be fabricated of glass of differing refractive indices. However, other materials may be used.

Figure 3:
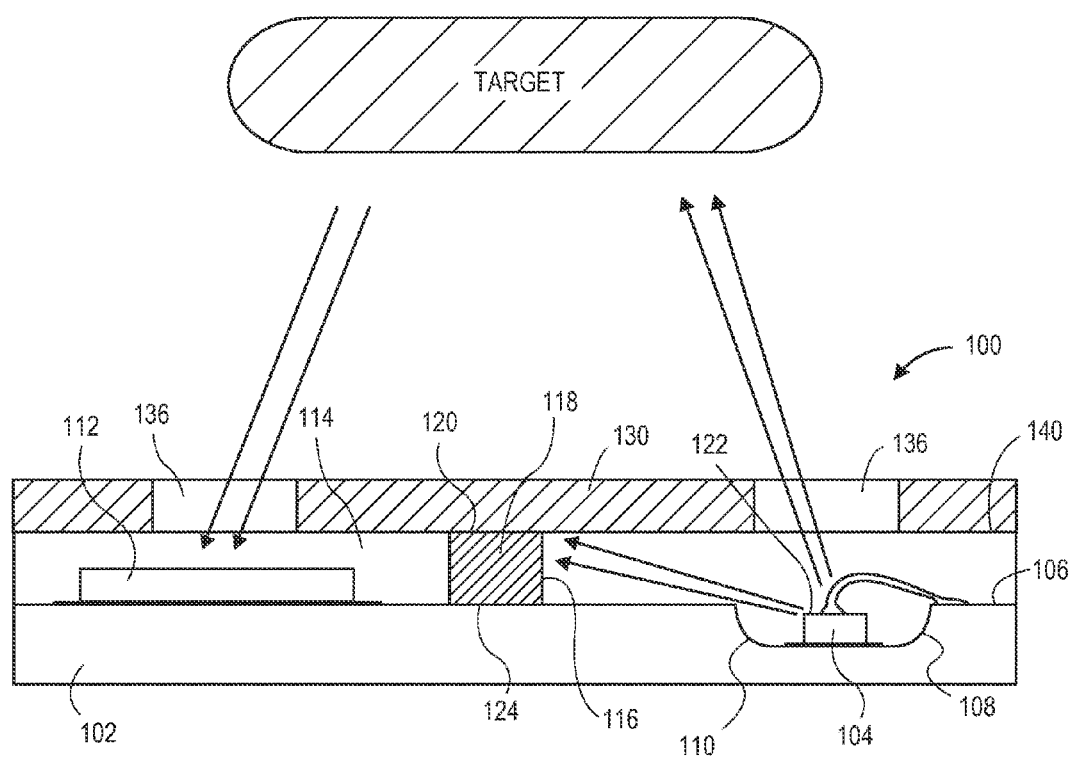
FIG. 3 is a diagrammatic partial cross-sectional elevation view illustrating the electronic device of FIG. 2 in an example environment, wherein the proximity sensor device is shown mounted within an electronic device beneath a cover.
Figure 6:
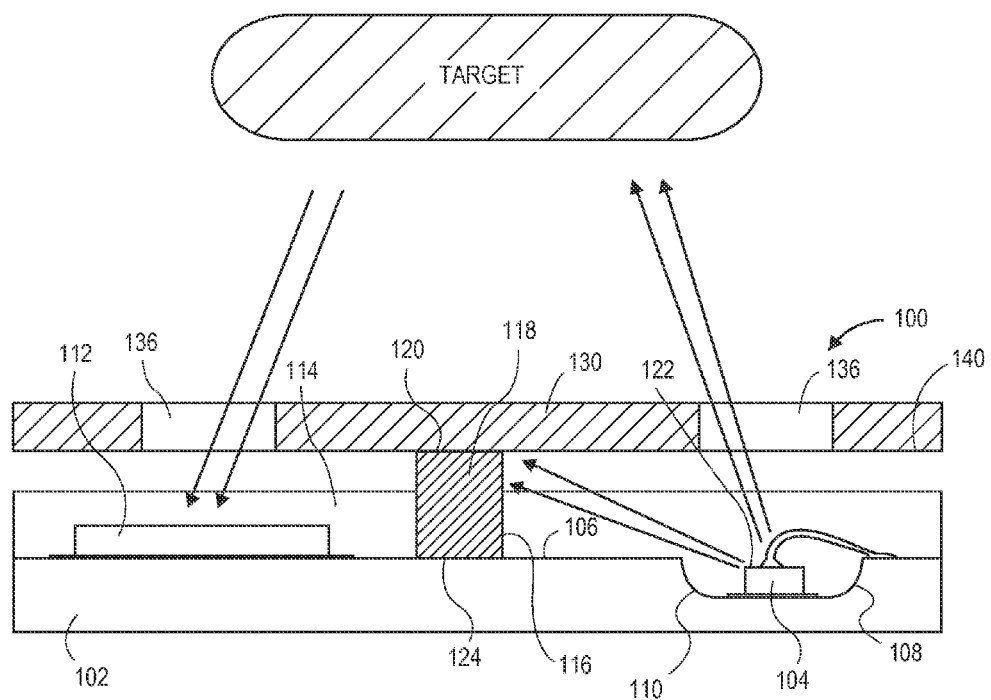
FIG. 6 is a diagrammatic partial cross-sectional elevation view illustrating the electronic device of FIG. 5 in an example environment, wherein the proximity sensor device is shown mounted within an electronic device beneath a cover.

In various implementations, the proximity sensor devices 100 are configured to be integrated within an electronic device to furnish proximity detection functionality to the device. As illustrated in FIGS. 3, 6, and 9, the proximity sensor device 100 may be positioned adjacent to a cover 130 of the device so that the cover 130 extends over at least a portion of the proximity sensor device 100. The cover 130 may be fabricated of a material that is at least substantially opaque (e.g., opaque glass) to electromagnetic radiation within the limited spectrum of wavelengths emitted by the light emitting diode 104 (e.g., infrared). As shown, optical windows 136 are provided in the cover 130 over the light emitting diode 104 and the light sensor assembly, respectively. The optical windows 136 may be at least substantially transparent (e.g., transparent glass) with a low refractive index to electromagnetic radiation within the limited spectrum of wavelengths emitted by the light emitting diode 104 (e.g., infrared). In this manner, the optical windows 136 are configured to allow electromagnetic radiation from the light emitting diode 104 and/or reflected from an object (target) to pass there through.

In the implementations illustrated in FIGS. 3 and 6, the proximity sensor device 100 is shown mounted (e.g., to a printed circuit board) immediately adjacent to the cover 130 so that the top surface 120 of the electromagnetic radiation blocking material 118 at least substantially abuts the cover 130 within an opaque area of the cover 130. For instance, in the implementation shown in FIGS. 1 through 3, the proximity sensor device 100 is mounted against the cover 130 so that the outer surface 140 of the encapsulation layer 114 rests against an inner surface of the cover 130. In this configuration, the top surface 120 of the electromagnetic radiation blocking material 118, which is flush with the outer surface 140 of the encapsulation layer 114, abuts the cover 130. Similarly, in the implementation shown in FIGS. 4 through 6, the proximity sensor device 100 is mounted adjacent to, but spaced away from, the cover 130 so that a thin gap is provided between the outer surface 140 of the encapsulation layer 114 and the inner surface of the cover 130. The electromagnetic radiation blocking material 118 extends beyond the outer surface 140 of the encapsulation layer 114 by a length that is at least equal to or greater than the thickness of the gap so that the top surface 120 of the electromagnetic radiation blocking material 118 abuts the cover 130. In this implementation, a resilient electromagnetic radiation blocking material 118 may be employed, allowing the material 118 to be compressed by the cover 130 to eliminate or reduce spaces between the material 118 and the inner surface of the cover 130.

In the implementation illustrated in FIG. 9, the proximity sensor device 100 is mounted so that space is provided between the device 100 and the cover 130 to accommodate the electromagnetic radiation barrier 128. As noted, the electromagnetic radiation barrier 128 is configured to further mitigate crosstalk due to electromagnetic radiation emitted by the light emitting diode 104 that is reflected from the cover 130 (see FIG. 9). The electromagnetic radiation barrier 128 may be integral with the cover 130, or may be a separate component that abuts the cover 130 along its top surface 132. The electromagnetic radiation barrier 128 may be attached to the cover via an adhesive.

Figure 10:
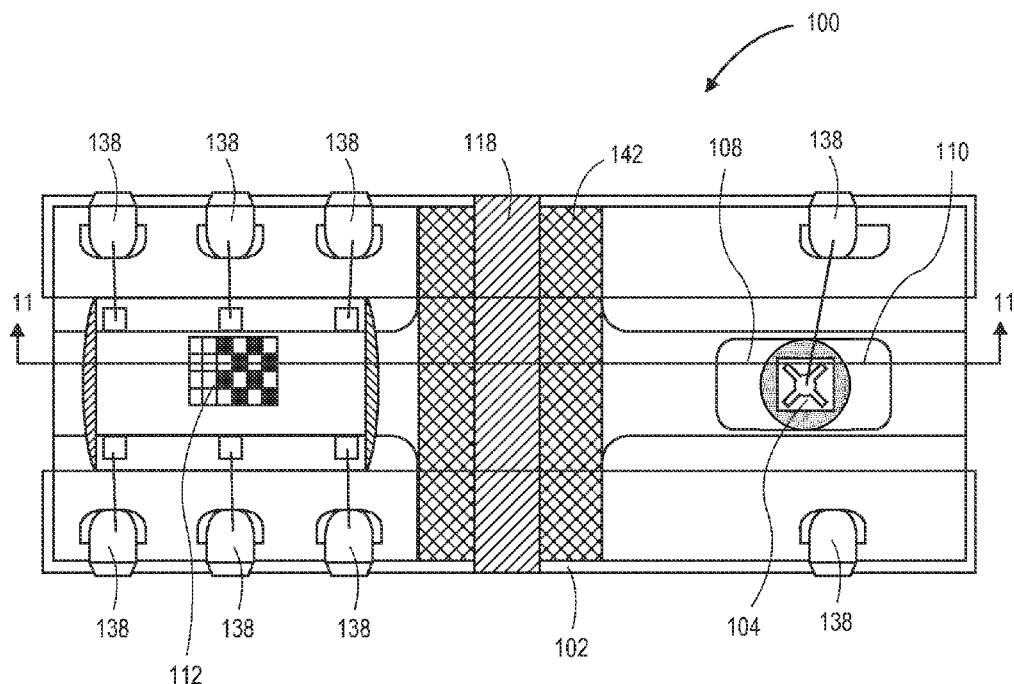
FIG. 10 is a diagrammatic top surface plan view illustrating a proximity sensor device in accordance with an example implementation of the present disclosure.
Figure 11:
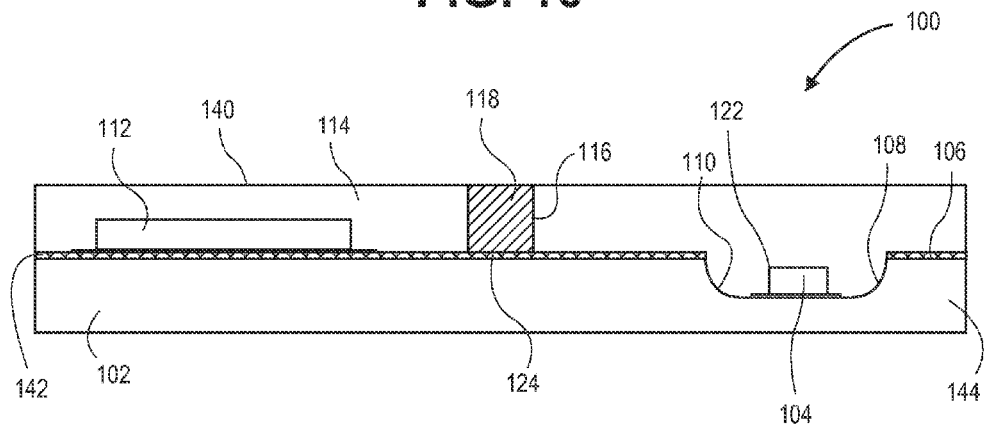
FIG. 11 is a diagrammatic cross-sectional side elevation view illustrating the proximity sensor device of FIG. 10 taken along plane 11-11.

In one or more implementations, the lead frame 102 of the proximity sensor device 100 may include a tab 142. As illustrated in FIGS. 10 and 11, the tab 142 extends beneath the trench 116 to prevent electromagnetic radiation from entering the substrate 144 (e.g., body) of the lead frame 102 and passing beneath the electromagnetic radiation blocking material 118. As illustrated in FIG. 11, the tab 142 is integral with the surface 106 of the lead frame 102. Thus, in implementations, the light sensor assembly 112 may be mounted over the tab 142. The tab 142 may be formed of a suitable material such as a metal (e.g., aluminum), or the like.

Figure 12:
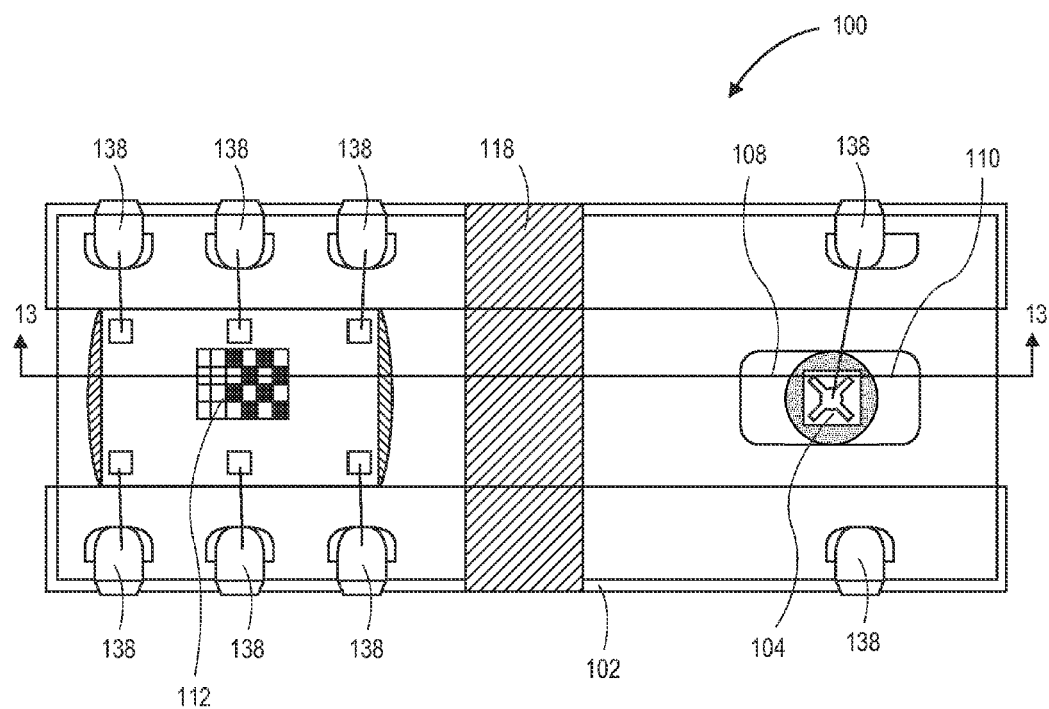
FIG. 12 is a diagrammatic top surface plan view illustrating a proximity sensor device in accordance with an example implementation of the present disclosure.
Figure 13:
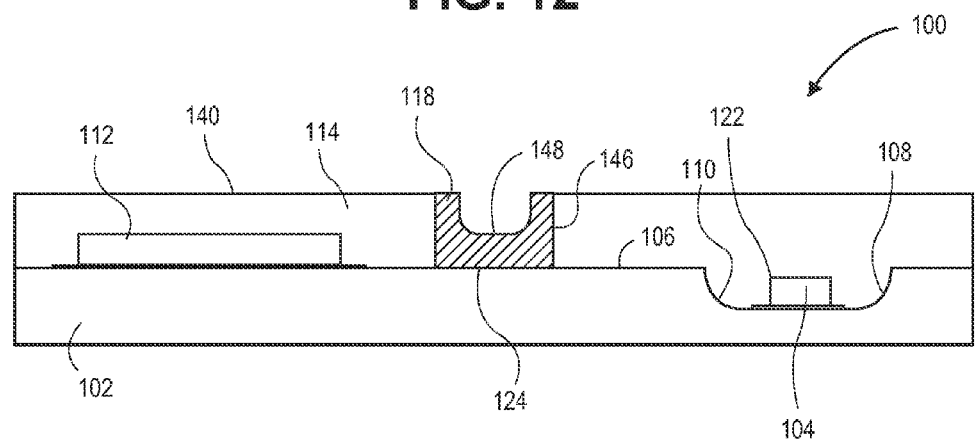
FIG. 13 is a diagrammatic cross-sectional side elevation view illustrating the proximity sensor device of FIG. 10 taken along plane 13-13.
Figure 14:
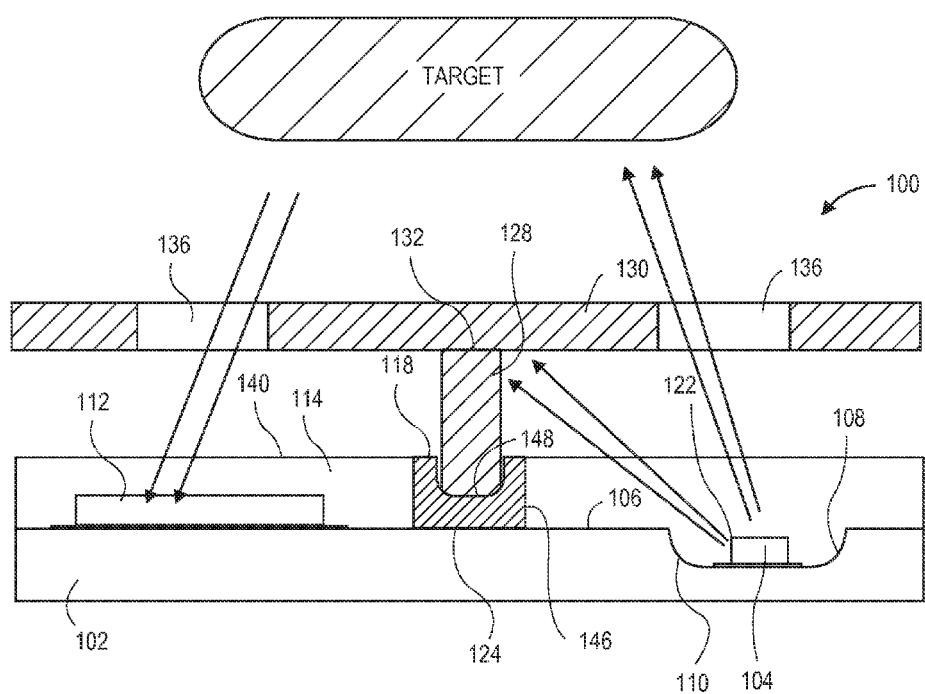
FIG. 14 is a diagrammatic partial cross-sectional elevation view illustrating the electronic device of FIG. 12 in an example environment, wherein the proximity sensor device is shown mounted within an electronic device beneath a cover.

In the implementation illustrated in FIGS. 12 through 14, the proximity sensor device 100 is shown with a widened trench 146. Like the trenches 116 illustrated above, the widened trench 146 is at least partially filled with electromagnetic radiation blocking material 118, and may be formed so that it extends completely through the encapsulation layer 114. In this manner, the electromagnetic radiation blocking material 118 may extend from at least the surface 106 of the lead frame 102 to an outer surface 140 of the encapsulation layer 114. Similarly, as with the trenches 116 illustrated above, it is contemplated that the widened trench 146 may extend past the surface 106 of the lead frame 102 and into the lead frame 102 so that the electromagnetic radiation blocking material 118 extends below the surface 106 of the lead frame 102. It is also contemplated that, in one or more implementations, the trench 146 may extend only partially through the encapsulation layer 114 (e.g., does not extend to the surface 106 of the lead frame 102). In such implementations, the electromagnetic radiation blocking material 118 would also not extend to the surface 106 of the lead frame 102.

As shown in FIG. 14, the electromagnetic radiation blocking material 118 is configured to receive the electromagnetic radiation barrier 128. For instance, the electromagnetic radiation blocking material 118 may be provided with a recessed area 148 formed in the electromagnetic radiation blocking material 118 (e.g., via a sawing process, an etching process, a molding process, or the like). The electromagnetic radiation barrier 128 may then be received in the recessed area 148 so that its lower edge is at least substantially surrounded by electromagnetic radiation blocking material 118.

The widened trench 146 may have adequate width to hold an amount (e.g., thickness) of electromagnetic radiation blocking material 118 that is sufficient to effectively block electromagnetic radiation from the light emitting diode 104 within the encapsulation layer 114 within the size constraints of the lead frame 102. Moreover, the trench 146 may have adequate width to allow for formation of the recessed area 148 in the electromagnetic radiation blocking material 118 to receive the electromagnetic radiation barrier 128. Thus, it will be appreciated that the depth and the width of trench 146 will depend on the particular design/performance requirements of the proximity sensor device 100 (e.g., the characteristics (size, power, sensitivity, etc.) of the light emitting diode 104 and light sensor assembly 112, the size of the lead frame 102, the thickness of the encapsulation layer 114, the encapsulation layer 114 material, the electromagnetic radiation blocking material 118 selected, the size of the electromagnetic radiation barrier 128, and so forth).

Figure 4:
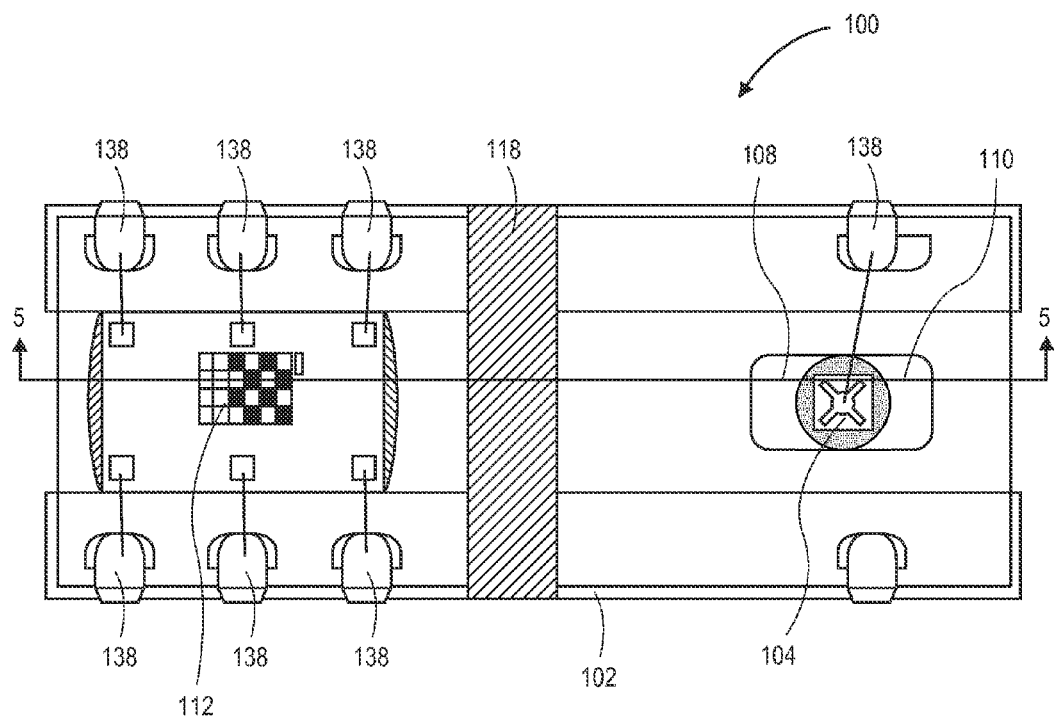
FIG. 4 is a diagrammatic top surface plan view illustrating a proximity sensor device in accordance with an example implementation of the present disclosure.
Figure 5:
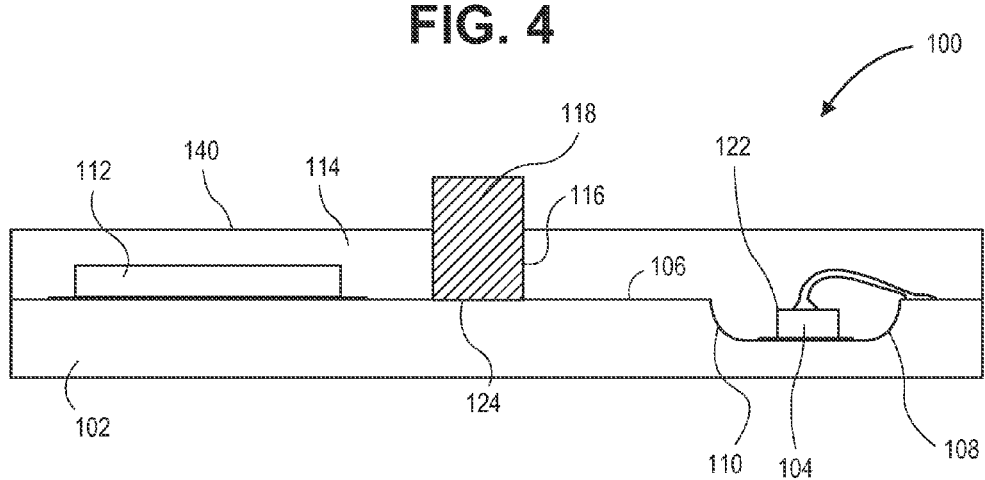
FIG. 5 is a diagrammatic cross-sectional side elevation view illustrating the proximity sensor device of FIG. 4 taken along plane 5-5.

As noted, the proximity sensor device 100 may employ a flat no leads package such as a QFN (Quad Flat No leads) package, a DFN (Dual Flat No leads) package, or the like. Thus, as illustrated in FIGS. 1, 4, and 7, the lead frame 102 may include one or more pads 138 that are configured to provide electrical connectivity to the components residing on the lead frame 102 (e.g., the light emitting diode 104, the light sensor assembly 112, etc.) via a suitable connection technique such as wire bonding, or the like. However, other configurations are possible.

As noted, the proximity sensor devices 100 described above are configured to be integrated within an electronic device to furnish proximity detection functionality to the device. It is contemplated that a wide variety of electronic devices may employ proximity sensor devices 100 in accordance with the present disclosure. Examples include, but are not limited to: televisions, portable computers, and mobile devices such as smart phones, mobile phones, tablet computers, hand-held gaming consoles, and so on. For instance, a smart phone manufacturer may integrate a proximity sensor device 100 into a smart phone to provide proximity detection functionality to the smart phone. This allows the phone's processing system (e.g., a microprocessor, digital processor, etc.) to automatically control the manipulation of a variety of functions provided by the smart phone when the phone is brought into close proximity with an object. For example, the smart phone may use the proximity sensor device 100 to detect the proximity of the phone to the head of its user (e.g., during a telephone call). In this example, the light emitting diode 104, an IR-LED, emits infrared light that is reflected off a portion of the ear and cheek of the user when the user holds the smart phone to his or her head. The reflected infrared light is received by the light sensor assembly 112. In response, the processing system may power off the display and the touch-screen of the phone to prevent inadvertent input to the touch-screen by the user's ear and cheek, and to conserve battery life. Moreover, the light sensor assembly 112 may be configured to sense the ambient light environment surrounding the electronic device (e.g., a smart phone, tablet computer, etc.). In this manner, the processing system of the device may be configured to automatically change the brightness, contrast, color, and so on of the display to provide an enhanced viewing experience to its user.

Example Fabrication Processes

Figure 15:
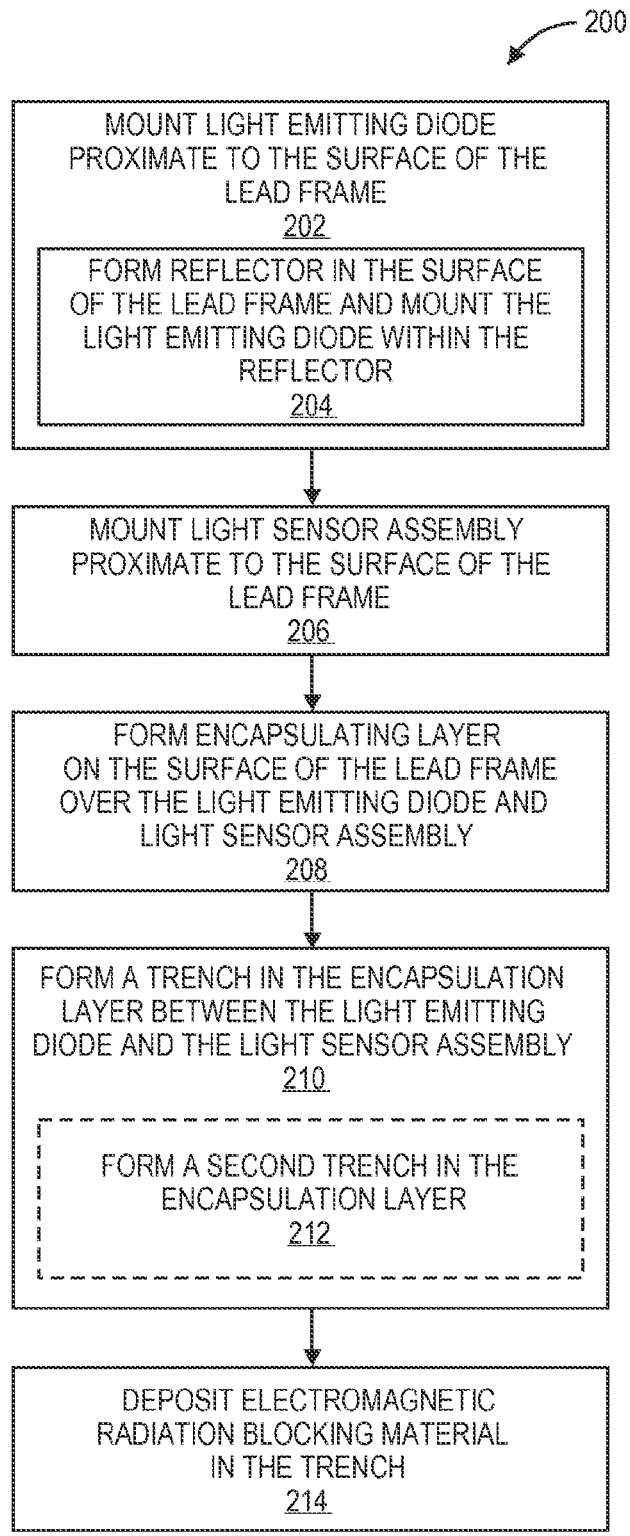
FIG. 15 is a flow diagram illustrating a process in an example implementation for fabricating proximity sensor devices in accordance with the present disclosure, such as the proximity sensor devices shown in FIGS. 1 through 14.

FIG. 15 illustrates an example process 200 that employs flat no leads packaging techniques to fabricate proximity sensors in accordance with the present disclosure, such as the proximity sensors 100 shown in FIGS. 1 through 14. In the process 200 illustrated, a light emitting diode is mounted proximate to a surface of a lead frame (Block 202). As noted, the light emitting diode may be configured to emit electromagnetic radiation in a limited spectrum of wavelengths. For example, in implementations, the light emitting diode may be comprised of an infrared light emitting diode that is configured to emit electromagnetic radiation in the infrared spectrum of wavelengths. The light emitting diode may be fabricated utilizing appropriate semiconductor fabrication techniques.

As described above, the light emitting diode may be contained in a reflector. Thus, as shown in FIG. 15, a reflector may first be formed in the surface of the lead frame using a suitable technique such as etching, or the like. The light emitting diode may then be mounted to the lead frame within the reflector (Block 204). As shown in FIGS. 1 through 14, the reflector may have a shape (e.g., parabolic, spherical, faceted, etc.) configured to collimate the electromagnetic radiation emitted from the light emitting diode to increase the peak power of the emitted electromagnetic radiation.

A light sensor assembly is mounted proximate to the surface of the lead frame (Block 206). As noted, the light sensor assembly is configured to detect the presence of nearby objects without any physical contact with the object by detecting electromagnetic radiation in the limited spectrum of wavelengths emitted by the light emitting diode that are reflected by a nearby object. The light sensor assembly may also be configured to detect the ambient light environment surrounding the proximity sensor device. Thus, in an implementation, the light sensor assembly may detect electromagnetic radiation occurring in the visible light spectrum and the infrared light spectrum incident on the light sensor assembly. The light sensor assembly may be fabricated utilizing suitable semiconductor fabrication techniques.

An encapsulation layer is next formed on the surface of the lead frame (Block 208) over the light emitting diode and the light sensor assembly. The encapsulation layer may comprise a plastic epoxy that is at least substantially transparent to electromagnetic radiation within the limited spectrum of wavelengths emitted by the light emitting diode. For example, in one or more implementations, the encapsulation layer may allow at least about ninety (90) percent of the electromagnetic radiation incident on the encapsulation layer to pass there through. The encapsulation layer may be formed using a suitable molding process to mold the epoxy onto the surface of the lead frame. In one or more implementations, the encapsulation layer may also be formed over a tab layer (Block 210). The tab layer comprises a layer (e.g., aluminum plating, or the like) integrated with the lead frame of the proximity sensor device to prevent electromagnetic radiation from entering the substrate of the sensor device.

A trench is then formed in the encapsulation layer (Block 210) between the light emitting diode and the light sensor assembly to receive electromagnetic radiation blocking material. In one or more implementations, a second trench may also be formed in the encapsulation layer (Block 212) adjacent to the first trench. The second trench is configured to receive an electromagnetic radiation barrier as described in the discussion of FIGS. 7 through 9. The trenches (e.g., the first trench, the second trench, the widened trench) may be formed in the encapsulation layer using a suitable sawing process. The use of a sawing process allows for precise control of the position, depth and width of the trenches. However, it is contemplated that other fabrication processes may be used to form the trenches. For example, the trenches may be formed using suitable molding processes. Other examples are possible.

Electromagnetic radiation blocking material is then deposited in the (first) trench (Block 214). The electromagnetic radiation blocking material is selected to block electromagnetic radiation in the limited spectrum of wavelengths emitted by the light emitting diode. However, it is contemplated that the electromagnetic radiation blocking material may also block electromagnetic radiation having other wavelengths (e.g., electromagnetic radiation in the visible light spectrum and the infrared light spectrum may be blocked by the electromagnetic radiation blocking material). In one example, the electromagnetic radiation blocking material may comprise an electromagnetic radiation blocking epoxy material, such as an infrared light blocking epoxy material, however other materials, including resilient materials, may be used.

In one or more implementations, a widened trench may be formed in the encapsulation layer (Block 212). For example, where a sawing process is used to form the trench, a double trench may be cut into the encapsulation layer by causing multiple passes to be made by the saw. The electromagnetic radiation blocking material is then deposited in the widened trench (Block 214). The electromagnetic radiation blocking material may be configured to receive the electromagnetic radiation barrier described in the discussion of FIGS. 12 through 14. For example, a suitable sawing process may be utilized to form a recessed area in the electromagnetic radiation blocking material that is capable of receiving the barrier. However, it is contemplated that other suitable techniques (e.g., etching, molding, etc.) may be utilized to form the recessed area.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A proximity sensor device comprising:
    a lead frame having a surface;
    a light emitting diode mounted to the lead frame proximate to the surface, the light emitting diode configured to emit electromagnetic radiation in a limited spectrum of wavelengths;
    a light sensor assembly mounted to the lead frame proximate to the surface, the light sensor assembly configured to detect electromagnetic radiation in the limited spectrum of wavelengths; and
    an encapsulation layer formed on the surface over the light emitting diode and light sensor assembly, the encapsulation layer including a trench formed therein to receive electromagnetic radiation blocking material, the electromagnetic radiation blocking material configured to block electromagnetic radiation in the limited spectrum of wavelengths to at least partially mitigate crosstalk between the light emitting diode and the light sensor assembly.

2. The proximity sensor device as recited in claim 1, wherein the light emitting diode is mounted within a reflector formed in the surface of the lead frame, the reflector configured to collimate the electromagnetic radiation emitted by the light emitting diode.

3. The proximity sensor device as recited in claim 2, wherein the reflector comprises a parabolic reflector.

4. The proximity sensor device as recited in claim 1, wherein the trench is formed through the encapsulation layer, and wherein the electromagnetic radiation blocking material extends from at least the surface of the lead frame to an outer surface of the encapsulation layer.

5. The proximity sensor device as recited in claim 1, wherein the light emitting diode comprises an infrared light emitting diode configured to emit electromagnetic radiation in the infrared light spectrum, and wherein the light sensor assembly comprises an infrared light sensor configured to detect electromagnetic radiation in the infrared light spectrum.

6. The proximity sensor device as recited in claim 5, wherein the electromagnetic radiation blocking material comprises an epoxy material configured to block electromagnetic radiation in the infrared light spectrum.

7. The proximity sensor device as recited in claim 1, wherein the encapsulation layer further includes a second trench formed therein between the trench and the light sensor assembly, the second trench configured to receive an electromagnetic radiation barrier operable to block electromagnetic radiation in the limited spectrum of wavelengths to further mitigate crosstalk between the light emitting diode and the light sensor assembly.

8. An proximity sensor device comprising:
    a lead frame having a surface;
    a light emitting diode mounted to the lead frame proximate to the surface, the light emitting diode configured to emit electromagnetic radiation in a limited spectrum of wavelengths;
    a light sensor assembly mounted to the lead frame proximate to the surface, the light sensor assembly configured to detect electromagnetic radiation in the limited spectrum of wavelengths;
    an encapsulation layer formed on the surface over the light emitting diode and light sensor assembly, the encapsulation layer including a trench formed therein between the light emitting diode and the light sensor assembly; and
    electromagnetic radiation blocking material disposed within the trench, the electromagnetic radiation blocking material configured to block electromagnetic radiation in the limited spectrum of wavelengths to at least partially mitigate crosstalk between the light emitting diode and the light sensor assembly.

9. The proximity sensor device as recited in claim 8, wherein the light emitting diode is mounted within a reflector formed in the surface of the lead frame, the reflector configured to collimate the electromagnetic radiation emitted by the light emitting diode.

10. The proximity sensor device as recited in claim 9, wherein the reflector comprises a parabolic reflector.

11. The proximity sensor device as recited in claim 8, wherein the trench is formed through the encapsulation layer, and wherein the electromagnetic radiation blocking material extends from at least the surface of the lead frame to an outer surface of the encapsulation layer.

12. The proximity sensor device as recited in claim 8, wherein the light emitting diode comprises an infrared light emitting diode configured to emit electromagnetic radiation in the infrared light spectrum, and wherein the light sensor assembly comprises an infrared light sensor configured to detect electromagnetic radiation in the infrared light spectrum.

13. The proximity sensor device as recited in claim 12, wherein the electromagnetic radiation blocking material comprises an epoxy material configured to block electromagnetic radiation in the infrared light spectrum.

14. The proximity sensor device as recited in claim 8, wherein the encapsulation layer further includes a second trench formed therein between the trench and the light sensor assembly, the second trench configured to receive an electromagnetic radiation barrier operable to block electromagnetic radiation in the limited spectrum of wavelengths to further mitigate crosstalk between the light emitting diode and the light sensor assembly.

15. A process comprising:
mounting a light emitting diode proximate to a surface of a lead frame, the light emitting diode configured to emit electromagnetic radiation in a limited spectrum of wavelengths;
mounting a light sensor assembly proximate to the surface of the lead frame, the light sensor assembly configured to detect electromagnetic radiation in the limited spectrum of wavelengths;
providing an encapsulation layer on the surface of the lead frame over the light emitting diode and the light sensor assembly, and
forming a trench in the encapsulation layer between the light emitting diode and the light sensor assembly to receive electromagnetic radiation blocking material, the electromagnetic radiation blocking material configured to block electromagnetic radiation in the limited spectrum of wavelengths to at least partially mitigate crosstalk between the light emitting diode and the light sensor assembly.

16. The process as recited in claim 15, wherein the mounting of the light emitting diode comprises etching a reflector into the surface of the lead frame and mounting the light emitting diode within the reflector, the reflector configured to collimate the electromagnetic radiation emitted by the light emitting diode.

17. The process as recited in claim 16, wherein the reflector comprises a parabolic reflector.

18. The process as recited in claim 15, further comprising depositing the electromagnetic radiation blocking material within the trench.

19. The process as recited in claim 18, wherein the trench is formed through the encapsulation layer, and wherein the electromagnetic radiation blocking material extends from at least the surface of the lead frame to an outer surface of the encapsulation layer.

20. The process as recited in claim 15, wherein the light emitting diode comprises an infrared light emitting diode configured to emit electromagnetic radiation in the infrared light spectrum, and wherein the light sensor assembly comprises an infrared light sensor configured to detect electromagnetic radiation in the infrared light spectrum.

21. The process as recited in claim 20, wherein the electromagnetic radiation blocking material comprises an epoxy material configured to block electromagnetic radiation in the infrared light spectrum.

22. The process as recited in claim 15, further comprises forming an encapsulation layer further includes a second trench formed therein between the trench and the light sensor assembly, the second trench configured to receive an electromagnetic radiation barrier operable to block electromagnetic radiation in the limited spectrum of wavelengths to further mitigate crosstalk between the light emitting diode and the light sensor assembly.

* * * * *